(12) United States Patent
Hitora et al.

(10) Patent No.: US 10,204,978 B2
(45) Date of Patent: Feb. 12, 2019

(54) CRYSTALLINE MULTILAYER OXIDE THIN FILMS STRUCTURE IN SEMICONDUCTOR DEVICE

(71) Applicant: FLOSFIA INC., Kyoto-shi, Kyoto (JP)

(72) Inventors: Toshimi Hitora, Kyoto (JP); Masaya Oda, Kyoto (JP)

(73) Assignee: FLOSFIA INC., Kyoto-shi (JP)

( * ) Notice: Subject to any disclaimer, the term of this patent is extended or adjusted under 35 U.S.C. 154(b) by 0 days.

(21) Appl. No.: 16/014,633

(22) Filed: Jun. 21, 2018

(65) Prior Publication Data

US 2018/0308924 A1 Oct. 25, 2018

Related U.S. Application Data

(63) Continuation of application No. 14/577,917, filed on Dec. 19, 2014.

(30) Foreign Application Priority Data

Mar. 31, 2014 (JP) .................................. 2014-072779

(51) Int. Cl.
*H01L 29/04* (2006.01)
*H01L 29/24* (2006.01)
(Continued)

(52) U.S. Cl.
CPC .......... *H01L 29/04* (2013.01); *H01L 21/0242* (2013.01); *H01L 21/02488* (2013.01);
(Continued)

(58) Field of Classification Search
CPC ................. H01L 29/04; H01L 21/0242; H01L 21/02488; H01L 21/02565;
(Continued)

(56) References Cited

U.S. PATENT DOCUMENTS

2004/0104472 A1* 6/2004 Murata ................... C23C 14/06
257/734
2007/0098618 A1* 5/2007 Teshima ................... C30B 9/02
423/328.2
(Continued)

FOREIGN PATENT DOCUMENTS

JP 2011151394 A 8/2011
JP 2013-028480 A 2/2013
(Continued)

OTHER PUBLICATIONS

Akaiwa, K., and S. Fujita, "Electrical Conductive Corundum-Structured α-Ga$_2$O$_3$ Thin Films on Sapphire With Tin-Doping Grown by Spray-Assisted Mist Chemical Vapor Deposition," Japanese Journal of Applied Physics 51(7R):070203-1-070203-3, Jul. 2012.

(Continued)

*Primary Examiner* — Didarul Mazumder
(74) *Attorney, Agent, or Firm* — Christensen O'Connor Johnson Kindness PLLC (57) ABSTRACT

Provided is a highly conductive crystalline multilayer structure including a corundum-structured crystalline oxide thin film whose resistance has not increased even after annealing (heating). The crystalline multilayer structure includes a base substrate and the corundum-structured crystalline oxide thin film disposed directly on the base substrate or with another layer therebetween. The crystalline oxide thin film is 1 μm or more in a thickness and 80 mΩcm or less in an electrical resistivity. A semiconductor device includes the crystalline multilayer structure.

15 Claims, 3 Drawing Sheets

(51) Int. Cl.
*H01L 29/26* (2006.01)
*H01L 29/66* (2006.01)
*H01L 29/78* (2006.01)
*H01L 29/86* (2006.01)
*H01L 29/87* (2006.01)
*H01L 21/02* (2006.01)
*H01L 21/47* (2006.01)
*H01L 21/477* (2006.01)
*H01L 29/786* (2006.01)
*H01L 29/872* (2006.01)
*H01L 29/861* (2006.01)

(52) U.S. Cl.
CPC .. *H01L 21/02565* (2013.01); *H01L 21/02628* (2013.01); *H01L 21/477* (2013.01); *H01L 29/24* (2013.01); *H01L 29/26* (2013.01); *H01L 29/66969* (2013.01); *H01L 29/7869* (2013.01); *H01L 29/78696* (2013.01); *H01L 29/8611* (2013.01); *H01L 29/872* (2013.01).

(58) Field of Classification Search
CPC . H01L 21/02628; H01L 21/477; H01L 29/24; H01L 29/26; H01L 29/66969; H01L 29/7869; H01L 29/78696; H01L 29/8611; H01L 29/872
USPC .................. 257/43; 438/85, 86, 104, 754
See application file for complete search history.

(56) References Cited

U.S. PATENT DOCUMENTS

| | | | | |
|---|---|---|---|---|
| 2011/0050733 | A1* | 3/2011 | Yano | C23C 14/086 345/690 |
| 2011/0156022 | A1* | 6/2011 | Yamazaki | H01L 29/42384 257/43 |
| 2011/0284848 | A1* | 11/2011 | Yamazaki | H01L 27/1225 257/57 |
| 2012/0061663 | A1* | 3/2012 | Yamazaki | H01L 21/02488 257/43 |
| 2012/0132903 | A1* | 5/2012 | Yamazaki | H01L 21/0242 257/43 |
| 2012/0319100 | A1* | 12/2012 | Yoshioka | H01L 21/324 257/43 |
| 2013/0175522 | A1* | 7/2013 | Shimayama | H01L 29/78693 257/43 |
| 2013/0248852 | A1* | 9/2013 | Yokozeki | H01L 29/786 257/43 |
| 2014/0127874 | A1 | 5/2014 | Yamazaki | |
| 2014/0175436 | A1* | 6/2014 | Yamazaki | H01L 27/1225 257/43 |
| 2014/0217471 | A1 | 8/2014 | Sasaki | |
| 2015/0194535 | A1 | 7/2015 | Yamazaki | |

FOREIGN PATENT DOCUMENTS

| | | |
|---|---|---|
| TW | 201138177 A | 11/2011 |
| WO | 2013/035843 A1 | 3/2013 |
| WO | 2013035844 A1 | 3/2013 |

OTHER PUBLICATIONS

Extended European Search Report dated Jul. 29, 2015, issued in corresponding European Application No. 14199082.0, 9 pages.

Shinohara, D., and S. Fujita, "Heteroepitaxy of Corundum-Structured α-GA$_2$O$_3$ Thin Films on α-Al$_2$O$_3$ Substrates by Ultrasonic Mist Chemical Vapor Deposition," Japanese Journal of Applied Physics 47(9):7311-7313, Sep. 2008.

Taiwan Office Action dated Jan. 21, 2016, in TW Application No. 104110316, filed Mar. 30, 2015, 6 pages.

Notification of Reasons for Refusal dated Dec. 19, 2017, issued in corresponding Japanese Application No. 2015-070468, filed Mar. 30, 2015, 7 pages.

Gin-Ichiro, O., et al., "Growth of α-Al203 Films by Molecular Layer Epitaxy," Appl. Phys. Lett. 51, 1143 (1987).

Corundum, University of California at Berkeley, Earth and Planetary Science Department, Classes-EPS2, Lecture 8 https://nature.berkeley.edu/classes/eps2/wisc/Lect8.html.

* cited by examiner

CRYSTALLINE MULTILAYER OXIDE THIN FILMS STRUCTURE IN SEMICONDUCTOR DEVICE

CROSS-REFERENCES TO RELATED APPLICATIONS

This application is a continuation of U.S. patent Ser. No. 14/577,917, filed Dec. 19, 2014, which claims priority from Japanese Patent Application No. 2014-072779, filed Mar. 31, 2014, both of which applications are expressly incorporated herein by reference.

TECHNICAL FIELD

The present invention relates to a crystalline multilayer structure and a semiconductor device.

BACKGROUND ART

Known methods for forming a gallium oxide-based thin film having high crystallinity on a sample to be deposited include a film forming method using water fine particles, such as the mist CVD method (Patent Literature 1: Japanese Unexamined Patent Application Publication No. 2013-28480). For example, this method is used as follows: a gallium compound such as gallium acetylacetonate is dissolved in an acid such as hydrochloric acid to prepare a raw-material solution; the raw-material solution is atomized into raw-material fine particles; the raw-material fine particles are carried by a carrier gas onto the film forming surface of the sample; and the raw-material fine particles being in a mist state is caused to react to form a thin film on the film forming surface. Thus, a gallium oxide-based thin film having high crystallinity is formed on the sample.

To form a semiconductor device using a gallium oxide-based thin film, it is required to control the electrical conductivity of the thin film. Patent Literature 1 and Non-Patent Literature 1 [Electrical Conductive Corundum-Structured α-$Ga_2O_3$ Thin Films on Sapphire with Tin-Doping Grown by Spray-Assisted Mist Chemical Vapor Deposition, *Japanese Journal of Applied Physics*, 51 (2012) 070203] disclose technologies for doping an α-gallium oxide thin film.

SUMMARY OF INVENTION

The methods of Patent Literature 1 and Non-Patent Literature 1 allow a formation of a highly conductive α-gallium oxide thin film. However, when the present inventors further examined these methods, they found that while about 300 nm-thick α-gallium oxide thin films formed using these methods were highly conductive immediately after these thin films were formed, the resistances thereof increased after the thin films were heated at 500° C. and thus the semiconductor properties and the electron conductivity thereof were lost. A typical semiconductor device manufacturing process includes a step in which films are formed and a following step in which the films are heated at 500° C. or more. Accordingly, increases in the resistance of the films by heating at such temperatures are a serious problem.

Typically, the control of the conductivity of a semiconductor material is focused on controlling the dopant concentration and improving the activation rate of the activation annealing subsequent to doping. Based on this principle, the inventors doped an α-gallium oxide thin film using methods disclosed in Patent Literature 1 and known documents and then heated the semiconductor in order to perform the activation annealing and the ohmic annealing. As a result, they faced a resistance increase (2 to 4 digit resistance value) problem.

A typical cause of the above resistance increase problem is that, when the contamination elements are heated, they move within the crystal and stay in positions in which they block the movement of electrons. From this viewpoint, the inventors took measures for eliminating the contamination elements. Further, in order to find an optimum annealing condition under which an electrically inactive state is achieved even when a trace amount of contamination element remained, the inventors took various measures, including the reduction of the annealing temperature, the optimization of the annealing profile, and the control of the annealing atmosphere. However, the resistance increase problem was not solved.

Taking the above-mentioned problems into consideration, the objective of the present invention is to provide a highly conductive crystalline multilayer structure including a corundum-structured crystalline oxide thin film whose resistance has not increased even after annealing (heating).

In order to achieve the above-mentioned objective, the present inventors have made intensive investigation. As the result, they found that when a 1 μm or more-thick corundum-structured crystalline oxide thin film was annealed, the electrical resistivity did not increase but rather decreased. The present inventors conducted further examination and then finally completed the present invention.

According to the present invention, a crystalline multilayer structure includes a base substrate and a corundum-structured crystalline oxide thin film disposed directly on the base substrate or with another layer therebetween. A thickness of the crystalline oxide thin film is 1 μm or more, and an electrical resistivity thereof is 80 mΩcm or less.

In the crystalline multilayer structure of the present invention, the corundum-structured crystalline oxide thin film has not increased in the resistance even after annealing and therefore is highly conductive. Accordingly, the crystalline multilayer structure is useful for semiconductor devices and the like.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DESCRIPTION OF EMBODIMENTS

A crystalline multilayer structure of an embodiment of the present invention includes a base substrate and a corundum-structured crystalline oxide thin film disposed directly on the base substrate or with another layer therebetween. The thickness of the crystalline oxide thin film is 1 μm or more and the electrical resistivity thereof is 80 mΩcm or less. As used herein, the "crystalline multilayer structure" refers to a structure including one or more crystal layers and may include layers other than the crystal layers (e.g., amorphous layers). Each crystal layer is preferably a monocrystalline layer, but may be a polycrystalline layer. The crystalline oxide thin film may be one which has been annealed after being formed. Further, due to the oxidation of an ohmic electrode by annealing, a metal oxide film may be formed between the crystalline thin film and the ohmic electrode. Examples of the ohmic electrode include indium and titanium.

Base Substrate

The base substrate is not particularly limited as long as it serves as a base for the crystalline oxide thin film, but is preferably a corundum-structured substrate. Examples of a corundum-structured substrate include sapphire substrates (e.g., c-plane sapphire substrates) and α-phase gallium oxide substrates. The base substrate needs not necessarily have a corundum structure. Examples of a base substrate not having a corundum structure include substrates having a hexagonal structure (e.g., 6H-SiC substrates, ZnO substrates, GaN substrates). For a substrate having a hexagonal structure, it is preferred to form a crystalline oxide thin film directly on the base substrate or with another layer (e.g., buffer layer) therebetween. The thickness of the base substrate is not particularly limited, but is preferably 50 to 2000 μm, more preferably 200 to 800 μm.

Crystalline Oxide Thin Film

The crystalline oxide thin film is not particularly limited as long as it is a corundum-structured crystalline oxide film. But it preferably includes a corundum-structured oxide semiconductor as a major component, since the semiconductor properties are improved. The crystalline oxide thin film also preferably includes a non-magnetic metal (e.g., Ga, Ti, V, In) as a major component rather than a magnetic metal (e.g., Fe, Co, Ni), since the semiconductor properties are improved. The crystalline oxide thin film is preferably monocrystalline, but may be polycrystalline. For the composition of the crystalline oxide thin film, preferably, the atomic ratio of the sum of gallium, indium, aluminum and iron to all the metal elements included in the thin film is 0.5 or more; more preferably, the atomic ratio of gallium to all the metal elements is 0.5 or more. The preferable atomic ratio is, for example, 0.5, 0.6, 0.7, 0.8, 0.9, or 1 and may be between any two of the values presented. Use of such a preferable atomic ratio allows the electrical resistivity to be more favorably reduced by annealing. If the atomic ratio of gallium to all the metal elements is 0.5 or more and the thickness of the corundum structured crystalline oxide thin film is less than 1 μm, the thin film significantly increases in resistance when annealed. In contrast, if the atomic ratio of gallium to all the metal elements is 0.5 or more and a thickness of the crystalline oxide thin film is 1 μm or more, the thin film significantly decreases in the electrical resistivity when annealed. In this case, the electrical resistivity of the crystalline oxide thin film is reduced to 80 mΩcm or less, while it is reduced preferably to 50 mΩcm or less, more preferably to 25 mΩcm or less.

The composition of the crystalline oxide thin film is preferably, for example, $In_XAl_YGa_ZFe_VO_3$ ($0 \leq X \leq 2.5$, $0 \leq Y \leq 2.5$, $0 \leq Z \leq 2.5$, $0 \leq V \leq 2.5$, $X+Y+Z+V=1.5$ to $2.5$), more preferably $1 \leq Z$. In this formula, preferable X, Y, Z, and V are each 0, 0.01, 0.05, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, 2, 2.1, 2.2, 2.3, 2.4, or 2.5. Preferable X+Y+Z+V is, for example, 1.5, 1.6, 1.7, 1.8, 1.9, 2, 2.1, 2.2, 2.3, 2.4, or 2.5. X, Y, Z, and V and X+Y+Z+V may each be between any two of the values presented. Note that the above-mentioned formula represents the composition of atoms on lattice points forming a corundum structure. As is apparent from the fact that the formula is not described in the form of "X+Y+Z+V=2", the formula may include a non-stoichiometric oxide, which then may include a metal-deficient oxide or an oxygen-deficient oxide.

The crystalline oxide thin film is formed directly on the base substrate or with another layer therebetween. Examples of the said another layer include corundum-structured crystal thin films having another composition, not-corundum-structured crystal thin films, and amorphous thin films.

The crystalline oxide thin film may be doped at least partially (more specifically, partially in the thickness direction). It may also have a monolayer structure or a multilayer structure. If the crystalline oxide thin film has the multilayer structure, it is formed by laminating thin films, for example, an insulating thin film and a conductive thin film. However, the present invention is not limited thereto. If the crystalline oxide thin film has the multilayer structure in which the insulating thin film and the conductive thin film are laminated, the compositions of these thin films may be the same or different. The thickness ratio of the conductive thin film to the insulating thin film is not particularly limited, but is preferably, for example, 0.001 to 100, more preferably 0.1 to 5. This more preferable ratio is, for example, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, 2, 3, 4, or 5, or may be between any two of the values presented.

The conductivity of the conductive thin film may be obtained by doping. The concentration of doping impurities is determined as appropriate based on properties of the conductive thin film is required to have and is, for example, $1E15/cm^3$ to $1E20/cm^3$. The type of the doping impurities is not particularly limited, but includes, for example, dopant containing at least one selected from Ge, Sn, Si, Ti, Zr, and Hf. The insulating thin film usually need not be doped, but may be doped to the extent that it does not exhibit conductivity.

The thickness of the crystalline oxide thin film in the present embodiment is 1 μm or more. Typically, a crystalline oxide thin film is formed with the thickness of about 300 nm. When a crystalline oxide thin film having such the thickness is heated, the resistance of the conductive thin film thereof is increased. This problem has not been solved anyhow. In the present embodiment, on the other hand, a crystalline oxide thin film is formed with the thickness of 1 μm or more. When this crystalline oxide thin film is heated, an increase in the resistance of the conductive thin film thereof is prevented. The upper limit of the thickness of the crystalline oxide thin film is not particularly limited, but is preferably 100 μm, more preferably 50 μm, most preferably 20 μm. The most preferable thickness of the crystalline oxide thin film is, for example, 1, 2, 3, 4, 5, 6, 7, 8, 9, 10, 11, 12, 13, 14, 15, 16, 17, 18, 19, or 20 μm, or may be between any two of the values presented. By setting such the thickness, the electrical resistivity can be more favorably reduced by annealing.

The crystalline multilayer structure of the present embodiment is manufactured by generating raw-material fine particles by atomizing a raw-material solution, carrying the raw-material fine particles into a film-forming chamber using a carrier gas, forming a corundum-structured crystalline oxide thin film having the thickness of 1 μm or more from the raw-material fine particles on the base substrate in the film-forming chamber, and then annealing the corundum-structured crystalline oxide thin film. Thus, the electrical resistivity of the crystalline oxide thin film is reduced to 80 mΩcm or less by the annealing.

A method of forming the crystalline oxide thin film is not particularly limited, but, for example, the crystalline oxide thin film can be formed by mixing a gallium compound, an indium compound, an aluminum compound, and an iron compound according to the composition of the crystalline oxide thin film and then oxidizing the resulting raw-material compound. Thus, a crystalline oxide thin film can be grown on the base substrate from the base substrate side. The gallium and indium compounds may be obtained by serving gallium metal and indium metal as start materials and converting them into the gallium and indium compounds immediately before forming a film. The gallium, indium, aluminum, and iron compounds are, for example, organometallic complexes (e.g., acetylacetonate complexes) or halides (fluorides, chlorides, bromides, or iodides) with respect to the respective metals. The dopant raw materials are, for example, metals or metal compounds (e.g., halides, oxides) serving as doping impurities. In order to form a thick film stably, it is possible to prevent an increase in surface roughness by introducing Br or I into the thick film. Conceivable dopants for controlling electron conductivity include, but not limited to, n-type dopants such as Ge, Sn, Si, Ti, Zr, or Hf. By introducing an n-type dopant which is ten or more times higher in concentration than Br or I, which serves as an abnormal grain inhibitor, the carrier density is easily controlled. Br or I, which serves as the abnormal grain inhibitor, may also be used as an n-type dopant to control electron conductivity.

By using such an abnormal grain inhibitor, it is possible to reduce the surface roughness (Ra) of the crystalline oxide thin film to 0.1 μm or less to further improve the semiconductor properties. As used herein, the surface roughness (Ra) refers to an arithmetic average roughness value obtained by making a measurement according to JIS B0601.

The x-ray half-width of the crystalline oxide thin film is not limited to a specific half-width. In particular, the x-ray half-width need not necessarily be improved, but when the crystalline oxide thin film is formed with the thickness of less than 1 μm. That is, even when the x-ray half-width of the crystalline oxide thin film is not improved, the resistance can be reduced by annealing.

More specifically, the crystalline oxide thin film can be formed by atomizing the raw-material solution having the raw-material compounds dissolved therein, generating the raw-material fine particles from the raw-material solution, carrying the raw-material fine particles into the film-forming chamber, and causing the raw-material compounds to react in the chamber. The solvent of the raw-material solution is preferably water, hydrogen peroxide water, or organic solvent. In order to form a doped thin film, the raw-material compounds may be oxidized in the presence of dopant raw-materials. The dopant raw materials are preferably added to the raw-material solution and then atomized with the raw-material compounds.

Note that according to the above process, the crystalline oxide thin film can be formed with the thickness of 1 μm or more by adjusting the film-forming time.

In the present embodiment, the electrical resistivity can be reduced to 80 mΩcm or less by annealing. The electrical resistivity (mΩcm) is measured using a four-point probe measurement device according to the four-point probe method (JIS H 0602: testing method of resistivity for silicon crystals and silicon wafers with four-point probe). The annealing temperature is not particularly limited as long as the electrical resistivity can be reduced to 80 mΩcm or less, but is preferably 600° C. or less, more preferably 550° C. or less, most preferably 500° C. or less. By annealing the crystalline oxide thin film at such the preferable temperature, the electrical resistivity can be reduced more favorably. The annealing time is not particularly limited as long as the objects of the present invention are not impaired, but is preferably 10 seconds to 10 hours, more preferably 10 seconds to one hour.

Example Configuration of Crystalline Multilayer Structure

Figure 1:
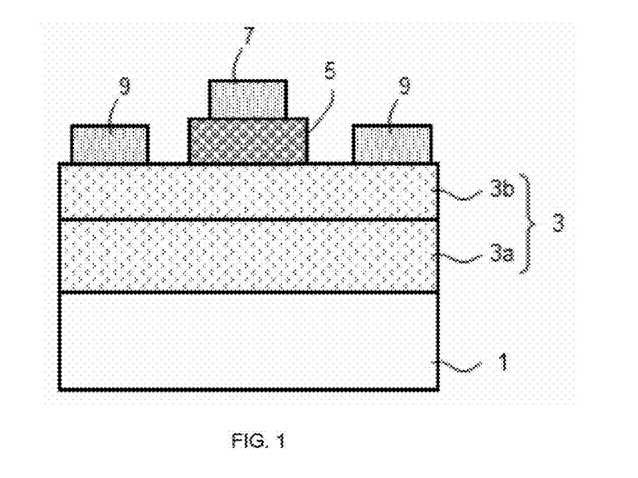
FIG. 1 shows an example configuration of a crystalline multilayer structure of an embodiment of the present invention.

FIG. 1 shows a preferred example of the crystalline multilayer structure of the present embodiment and a semiconductor device using the crystalline multilayer structure. In an example of FIG. 1, a crystalline oxide thin film 3 is formed on a base substrate 1. The crystalline oxide thin film 3 is formed by laminating an insulating thin film 3a and a conductive thin film 3b in this order from the base substrate side. A gate insulating film 5 is formed on the conductive thin film 3b. A gate electrode 7 is formed on the gate insulating film 5. Source/drain electrodes 9 are formed on the conductive thin film 3b so as to sandwich the gate electrode 7. Such a configuration allows for a control of a depletion layer formed in the conductive thin film 3b by an application of a gate voltage to the gate electrode 7, thereby allowing for a transistor operation (FET device).

Examples of a semiconductor device formed using the crystalline multilayer structure of the present embodiment include transistors or TFTs such as MIS or HEMT, Schottky barrier diodes using a metal-semiconductor junction, p-n or PIN diodes combined with another p-type layer, and light emitting/receiving devices.

Example

Described below is an Example of the present invention. While a doped crystalline oxide thin film is formed by the mist CVD in the Example below, the present invention is not limited to this Example.

1. CVD Apparatus

Figure 2:
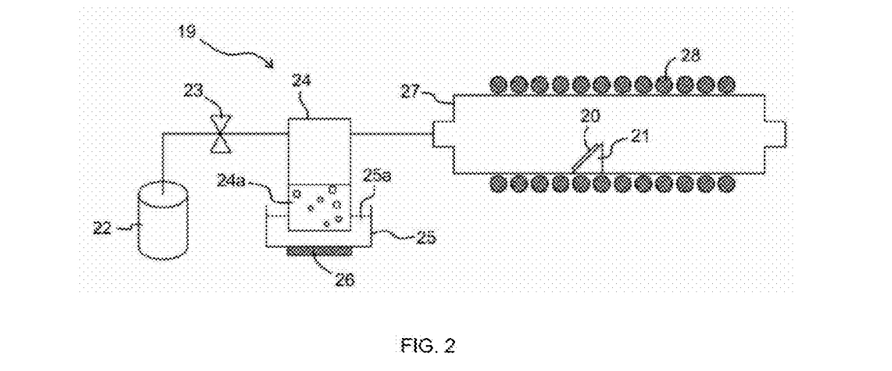
FIG. 2 is a configuration diagram of a mist CVD apparatus used in Example of the present invention.

First, referring to FIG. 2, a CVD apparatus 19 used in this Example will be described. The CVD apparatus 19 includes a sample stage 21 for placing a sample 20 on which films are to be formed, such as a base substrate, a carrier-gas source 22 for providing a carrier gas, a flow rate control valve 23 for controlling the flow rate of the carrier gas sent from the carrier-gas source 22, a mist source 24 including a raw-material solution 24a, a container 25 containing water 25a, an ultrasonic transducer 26 attached to the bottom of the container 25, a film forming chamber 27 formed of a 40-mm-inner-diameter quartz tube, and a heater 28 disposed around the film forming chamber 27. The sample stage 21 is formed of quartz, and the surface thereof for placing the sample 20 is inclined from the horizontal plane. By forming both the film forming chamber 27 and the sample stage 21 from quartz, entry of apparatus-derived impurities into the films formed on the sample 20 is reduced.

2. Preparation of Raw-Material Solution

Condition 1

An aqueous solution was prepared from gallium bromide and germanium oxide such that the atomic ratio of germanium to gallium was 1:0.05. To facilitate dissolution of germanium oxide, a 48% solution of hydrobromic acid was added to the aqueous solution at a volume percent of 10%.

Condition 2

Another aqueous solution was prepared such that the molar ratio between gallium bromide and tin bromide is 1:0.01. To facilitate dissolution, a 48% solution of hydrobromic acid was added to the aqueous solution at a volume percent of 10%.

In both conditions 1 and 2, the concentration of gallium bromide was set to $1.0 \times 10^{-2}$ mol/L. Each raw-material solution 24a thus prepared was injected into the mist source 24.

3. Preparation for Film Forming

Next, a 10 mm-side square, 600 μm-thick c-plane sapphire substrate was placed as the sample 20 on the sample stage 21. Then the heater 28 was activated to raise the temperature in the film forming chamber 27 to 500° C. Next, the flow rate control valve 23 was opened to send the carrier gas from the carrier-gas source 22 into the film forming chamber 27. After the carrier gas sufficiently substituted for the atmosphere in the film forming chamber 27, the flow rate of the carrier gas was adjusted to 5 L/min. An oxygen gas was used as the carrier gas.

4. Formation of Thin Film

Next, the ultrasonic transducer 26 was vibrated at 2.4 MHz so that the vibration was propagated to the raw-material solution 24a through the water 25a. Thus, the raw-material solution 24a was atomized into raw-material fine particles. The raw-material fine particles were carried into the film forming chamber 27 by the carrier gas and then the thin film was formed by a CVD reaction on the film forming surface of the sample 20. The film thickness was controlled by adjusting the film forming time.

5. Evaluation

The phases of the respective thin films formed under conditions 1 and 2 were identified. The identification was made by 2θ/ω scanning each thin film at angles of 15 to 95 degrees using an XRD diffractometer for thin films. Then, measurements were made using CuKα rays. As a result, the formed thin films were found to be corundum-structured α-gallium oxide thin films.

After 0.5 mm-diameter indium electrodes were pressure-bonded on each thin film at intervals of 1 mm, each thin film was annealed at 500° C. in a nitrogen atmosphere for 20 minutes. After annealing, XRD measurements were made again. It was confirmed that no phase transition occurred and the crystal structure of α-gallium oxide was maintained.

Note that in this Example, the thicknesses of the thin films were measured using an interference thickness meter.

Figure 3:
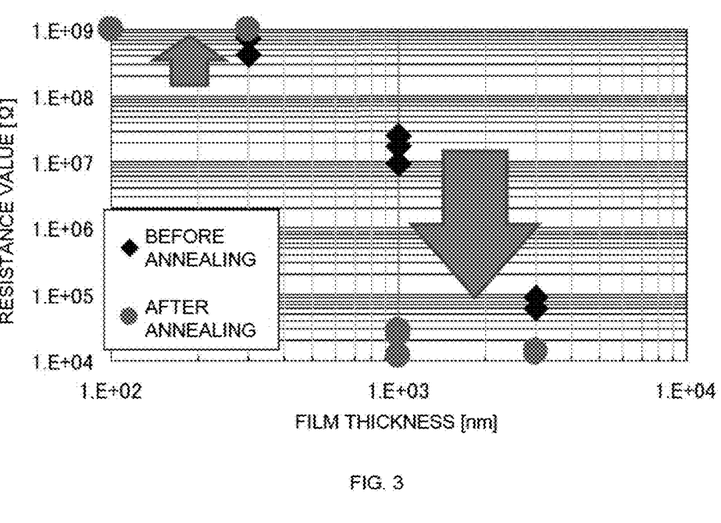
FIG. 3 is a graph showing the relationship between the thickness of a crystalline oxide thin film and the resistance value according to Example of the present invention.

FIG. 3 shows annealing-induced changes in the resistance of the α-gallium oxide thin films formed under condition 1. As is apparent in FIG. 3, when the up to 0.3 μm-thick α-gallium oxide thin films disclosed in Patent Literature 1 or Non-Patent Literature 1 were annealed, the resistance increased; when the 1 μm-thick α-gallium oxide thin film of the present embodiment was annealed, the resistance dramatically decreased.

Annealing-induced changes in the resistance of the α-gallium oxide thin films formed under condition 2 were evaluated as well. The results are shown in Table 1. As shown in Table 1, no resistance increase was observed in the 1 μm or more-thick α-gallium oxide thin films, whether the dopant is Ge or Sn.

TABLE 1

| Film thickness | Ge (condition 1) | Sn (condition 2) |
| --- | --- | --- |
| 0.1 μm | x | x |
| 0.3 μm | x | x |
| 1 μm | o | o |
| 2 μm or more | o | — | o: Resistance decreased by annealing
x: Resistance increased by annealing
—: Not performed Then, 0.3 and 1 μm-thick β-gallia-structured β-gallium oxide thin films were formed on a β-gallia-structured base substrate under the same condition as in condition 1 and then annealed at 500° C. in a nitrogen atmosphere for 20 minutes. Then, the above α-gallium oxide thin films were compared with the resulting thin films. The results are shown in Table 2. While the 0.3 μm-thick β-gallia oxide thin film did not increase in resistance, the 0.3 μm-thick α-gallium oxide thin film increased in resistance. This result suggests that an increase in the resistance of a conductive thin film is a problem specific to a corundum-structured crystalline oxide thin film. In Table 2, "○" indicates that the electrical resistivity was 80 mΩcm or less.

TABLE 2

| Film thickness | α-gallium oxide | β-gallium oxide |
| --- | --- | --- |
| 0.1 μm | x | — |
| 0.3 μm | x | Δ |
| 1 μm | o | Δ |
| 2 μm or more | o | — | o: Resistance decreased to 1.0E+5Ω or less
Δ: Resistance did not change
x: Resistance increased to 1.0E+7Ω or more Next, it was checked how the resistances of α-gallium oxide thin films formed under condition 1 changed depending on the annealing condition. As shown in Table 3, the 300 nm (0.3 μm)-thick thin film increased in resistance at all the annealing temperatures. In Table 3, "○" indicates that the electrical resistivity was 80 mΩcm or less.

TABLE 3

| Annealing temperature | 0.3 μm | 1 μm |
| --- | --- | --- |
| 400° C. | Δ | o |
| 500° C. | x | o |
| 600° C. | x | — | o: 1.0E+5Ω or less
Δ: 1.0E+5Ω to 1.0E+7Ω
x: 1.0E+7Ω or more (Comparative Example)

An α-gallium oxide thin was formed on an sapphire substrate under the same condition as in condition 1 except that there was no annealing and the film-forming conditions were set as shown in Table 4. The film thickness and the specific resistance of the obtained crystalline multilayer structure were measured. The result is shown in Table 4.

TABLE 4

| Film-forming temperature | Buffer layer | Carrier gas | Film thickness | Specific resistance value |
| --- | --- | --- | --- | --- |
| 500° C. | α-Ga$_2$O$_3$ (formed at 800° C.) | Forming gas | 8.3 μm | 178 mΩcm |

(Test Example: TEM Image)

Figure 4:
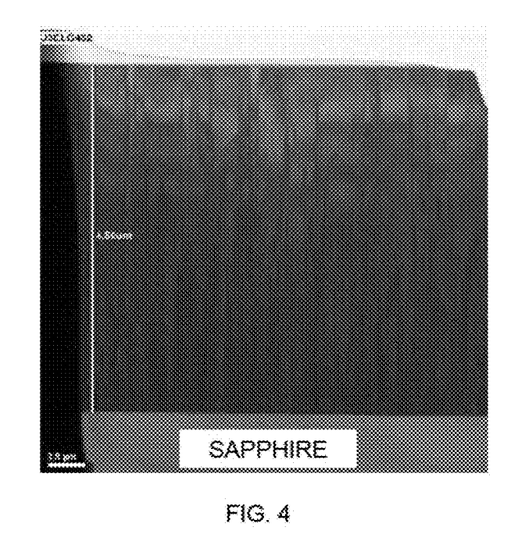
FIG. 4 is a TEM image in Test Example.
Figure 5:
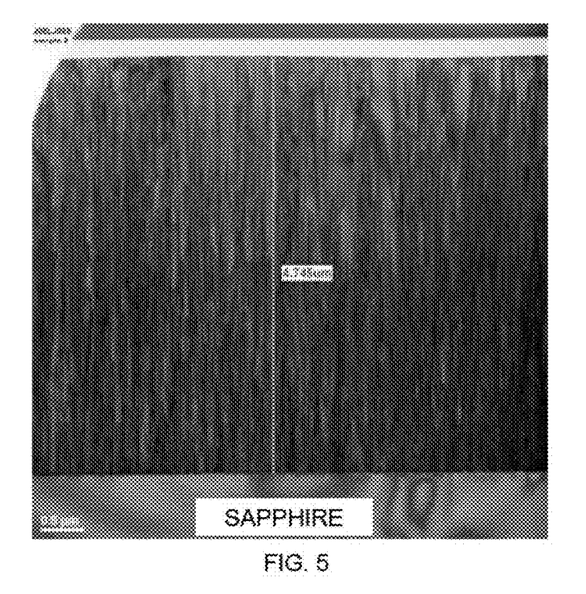
FIG. 5 is a TEM image in Test Example.

An α-gallium oxide thin was formed on an sapphire substrate under the same condition as in condition 1 except that the film-forming temperature was set to 600° C. The film thickness of the obtained crystalline multilayer structure was measured by use of TEM. The obtained TEM image is shown in FIG. 4. The film thickness was measured to be 4.56 μm. A TEM image for the crystalline multilayer structure obtained in Comparative Example is shown in FIG. 5.

The crystalline multilayer structure of the present invention is useful for semiconductor devices, including transistors or TFTs such as MIS or HEMT, Schottky barrier diodes using a metal-semiconductor junction, p-n or PIN diodes combined with another p-type layer, and light emitting/receiving devices.

The invention claimed is:

1. A corundum-structured crystalline oxide film comprising:
   metal elements that contain gallium (Ga),
   in which the corundum-structured crystalline oxide film has a thickness of 1 μm or more and an electrical resistivity of 80 mΩcm or less, and
   in which the corundum-structured crystalline oxide film has an atomic ratio of gallium (Ga) to all of the metal elements comprised in the corundum-structured crystalline oxide film to be 0.5 or more.

2. The corundum-structured crystalline oxide film of claim 1, wherein the corundum-structured crystalline oxide film has a surface roughness (Ra) of 0.1 μm or less.

3. The corundum-structured crystalline oxide film of claim 1, wherein the thickness of the corundum-structured crystalline oxide film is 1 μm to 20 μm.

4. The corundum-structured crystalline oxide film of claim 1, wherein the corundum-structured crystalline oxide film contains a dopant.

5. The corundum-structured crystalline oxide film of claim 4, wherein the dopant has a concentration that is 1E15/cm to 1E20/cm.

6. The corundum-structured crystalline oxide film of claim 5, wherein the dopant contains at least one selected from Ge, Sn, Si, Ti, Zr, and Hf.

7. A semiconductor device comprising:
   a corundum-structured crystalline oxide film comprising metal elements that contain gallium (Ga),
   in which the corundum-structured crystalline oxide film has a thickness of 1 μm or more and an electrical resistivity of 80 mΩcm or less, and
   in which the corundum-structured crystalline oxide film has an atomic ratio of gallium (Ga) to all of the metal elements comprised in the corundum-structured crystalline oxide film to be 0.5 or more.

8. The semiconductor device of claim 7, wherein the corundum-structured crystalline oxide film has a surface roughness (Ra) of 0.1 μm or less.

9. The semiconductor device of claim 7, wherein the thickness of the corundum-structured crystalline oxide film is 1 μm to 20 μm.

10. The semiconductor device of claim 7, wherein the corundum-structured crystalline oxide film contains a dopant.

11. The semiconductor device of claim 10, wherein the dopant has a concentration that is $1E15/cm^3$ to $1E20/cm^3$.

12. The semiconductor device of claim 10, wherein the dopant contains at least one selected from Ge, Sn, Si, Ti, Zr, and Hf.

13. The semiconductor device of claim 7, further comprising:
    an electrode that is electrically connected to the corundum-structured crystalline oxide film.

14. The semiconductor device of claim 13, wherein the electrode is disposed on the corundum-structured crystalline oxide film.

15. The semiconductor device of claim 13, wherein the electrode is an ohmic electrode.

* * * * *

UNITED STATES PATENT AND TRADEMARK OFFICE
CERTIFICATE OF CORRECTION

PATENT NO. : 10,204,978 B2
APPLICATION NO. : 16/014633
DATED : February 12, 2019
INVENTOR(S) : T. Hitora et al.

Page 1 of 1

It is certified that error appears in the above-identified patent and that said Letters Patent is hereby corrected as shown below:

In the Claims

| Column | Line | Error |
|---|---|---|
| 9 (Claim 5, Line 3) | 30 | "1E15/cm to 1E20/cm" should read --1E15/cm$^3$ to 1E20/cm$^3$-- |

Signed and Sealed this
Thirtieth Day of April, 2019

Andrei Iancu
*Director of the United States Patent and Trademark Office*